(12) United States Patent
Ihara

(10) Patent No.: US 8,294,253 B2
(45) Date of Patent: Oct. 23, 2012

(54) SEMICONDUCTOR DEVICE, ELECTRONIC DEVICE AND METHOD OF MANUFACTURING SEMICONDUCTOR DEVICE, HAVING ELECTRONIC COMPONENT, SEALING RESIN AND MULTILAYER WIRING STRUCTURE

(75) Inventor: Yoshihiro Ihara, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 221 days.

(21) Appl. No.: 12/722,769

(22) Filed: Mar. 12, 2010

(65) Prior Publication Data
US 2010/0230823 A1 Sep. 16, 2010

(30) Foreign Application Priority Data
Mar. 13, 2009 (JP) ................ P2009-061271

(51) Int. Cl.
*H01L 23/02* (2006.01)
*H01L 23/48* (2006.01)
(52) U.S. Cl. ................ 257/686; 257/777; 257/778
(58) Field of Classification Search ........... 257/686, 257/777, 778
See application file for complete search history.

(56) References Cited

U.S. PATENT DOCUMENTS

| | | | |
|---|---|---|---|
| 6,271,469 B1 | 8/2001 | Ma et al. | |
| 7,122,901 B2 * | 10/2006 | Sunohara et al. | 257/758 |
| 7,619,304 B2 * | 11/2009 | Bauer et al. | 257/678 |
| 7,622,733 B2 * | 11/2009 | Fuergut et al. | 257/40 |
| 7,863,088 B2 * | 1/2011 | Brunnbauer et al. | 438/106 |
| 8,168,470 B2 * | 5/2012 | Lin et al. | 438/107 |
| 2004/0154163 A1 | 8/2004 | Miyazaki et al. | |
| 2004/0232543 A1 * | 11/2004 | Goller et al. | 257/700 |
| 2005/0161833 A1 * | 7/2005 | Takeuchi et al. | 257/775 |
| 2007/0035033 A1 * | 2/2007 | Ozguz et al. | 257/777 |
| 2008/0111233 A1 * | 5/2008 | Pendse | 257/712 |
| 2008/0217792 A1 * | 9/2008 | Onodera et al. | 257/778 |
| 2009/0014858 A1 * | 1/2009 | Boon et al. | 257/686 |
| 2009/0294942 A1 * | 12/2009 | Palmer et al. | 257/686 |
| 2010/0213616 A1 | 8/2010 | Uchiyama | |

* cited by examiner

*Primary Examiner* — James Mitchell
(74) *Attorney, Agent, or Firm* — Drinker Biddle & Reath LLP

(57) ABSTRACT

A semiconductor device includes: an electronic component including an electrode pad forming face on which electrode pads are formed, a back face opposite to the electrode pad forming face; a sealing resin including a first face provided on the electrode pad forming face side and a second face provided on the back face side, and provided around the electronic component to seal up a side face of the electrode component; a multilayer wiring structure which is provided on the first face, and in which insulating layers, a wiring pattern and external connecting pads are stacked on each other; and a conductive member which is provided in a through-hole passing through the sealing resin and the insulating layer. The wiring pattern is directly connected to the electrode pads and the external connecting pads, and includes a wiring provided in the insulating layers. The conductive member is connected to the wiring.

12 Claims, 18 Drawing Sheets

SEMICONDUCTOR DEVICE, ELECTRONIC DEVICE AND METHOD OF MANUFACTURING SEMICONDUCTOR DEVICE, HAVING ELECTRONIC COMPONENT, SEALING RESIN AND MULTILAYER WIRING STRUCTURE

This application claims priority from Japanese Patent Application No. 2009-061271, filed on Mar. 13, 2009, the entire contents of which are hereby incorporated by reference.

FIELD OF THE INVENTION

The present invention relates to a semiconductor device, an electronic device and a method of manufacturing the semiconductor device, and particularly, relates to a semiconductor device, an electronic device and a method of manufacturing the semiconductor device provided with an electronic component, sealing resin for sealing up the electronic component, and a multilayer wiring structure formed on the electronic component and the sealing resin and electrically connected to the electronic component.

DESCRIPTION OF RELATED ART

FIG. 1 is a cross-sectional view of a semiconductor device of a related art. In the related-art semiconductor device, electrode pads of an electronic component are directly connected to a wiring pattern of a multilayer wiring structure to reduce a size in thickness.

The related-art semiconductor device 200 shown in FIG. 1 has an electronic component 201, a sealing resin 202, a multilayer wiring structure 203, and external connection terminals 205.

The electronic component 201 has electrode pads 211, an electrode pad forming face 201A on which the electrode pads 211 are formed, a back face 201B opposite to the electrode pad forming face 201A, and a side face 201C. The electronic component 201 is sealed up by the sealing resin 202 with the electrode pads 211 and the electrode pad forming face 201A exposed. For example, a semiconductor chip can be used as the electronic component 201.

The sealing resin 202 seals up the back face 201B and the side face 201C of the electronic component 201. The sealing resin 202 has a multilayer wiring structure forming face 202A formed on a same plane as a plane on which the electrode pad forming face 201A are formed.

The multilayer wiring structure 203 has a stack portion 213, external connecting pads 214, a wiring pattern 215, and a solder resist layer 217.

The stack portion 213 is formed by sequentially stacking an insulating layer 221 and an insulating layer 222 on the electrode pads 211, the electrode pad forming face 201A, and the multilayer wiring structure forming face 202A.

The external connecting pads 214 are provided on face 222A (face opposite to a face of the insulating layer 222 being in contact with the insulating layer 221) of the insulating layer 222.

The wiring pattern 215 is provided in the stack portion 213. The wiring pattern 215 is directly connected to the electrode pads 211 and the external connecting pads 214.

The solder resist layer 217 is provided on the face 222A of the insulating layer 222. The solder resist layer 217 has opening portions 217A exposing the external connecting pads 214 at parts corresponding to areas for providing the external connection terminals 205.

The external connection terminals 205 are provided on the external connecting pads 214 at parts exposed from the opening portions 217A. The external connection terminals 205 are terminals for electrically connecting a mounting board (not shown) such as a main board to the semiconductor device 200. For example, solder balls can be used as the external connection terminals 205 (see U.S. Pat. No. 6,271,469).

In the related-art semiconductor device 200, it is possible to reduce a size in thickness of the semiconductor device 200, but another semiconductor device (not shown) cannot be mounted on the semiconductor device 200 (in other word, mounting density cannot be improved) since the semiconductor device 200 is not provided with a conductive member (e.g., pads or the like) capable of mounting the other semiconductor device.

SUMMARY OF INVENTION

Illustrative aspects of the present invention provide a semiconductor device, an electronic device and a method of manufacturing the semiconductor device capable of mounting the other semiconductor device on the semiconductor device while reducing a size in thickness of the semiconductor device.

According to a first aspect of the invention, a semiconductor device includes: an electronic component which includes an electrode pad forming face on which electrode pads are formed, and a back face opposite to the electrode pad forming face; a sealing resin which includes a first face provided on the electrode pad forming face side and a second face provided on the back face side, and which is provided around the electronic component to seal up side faces of the electrode component; a multilayer wiring structure which is provided on the first face of the sealing resin, and in which a plurality of insulating layers, a wiring pattern and external connecting pads are stacked on each other, the plurality of insulating layers including a first insulating layer being in contact with the sealing resin; and a conductive member which is provided in a through-hole passing through the sealing resin and the first insulating layer. The wiring pattern is directly connected to the electrode pads and the external connecting pads, and includes a wiring provided on a first contact face of the first insulating layer opposite to a second contact face of the first insulating layer being in contact with the sealing resin. The conductive member is connected to the wiring.

Other aspects and advantages of the invention will be apparent from the following description, the drawings and the claims.

DETAILED DESCRIPTION OF EXEMPLARY EMBODIMENTS

Hereinafter, an exemplary embodiment of the invention will be described with reference to FIGS. 2 to 18.

Exemplary Embodiment

Figure 1:
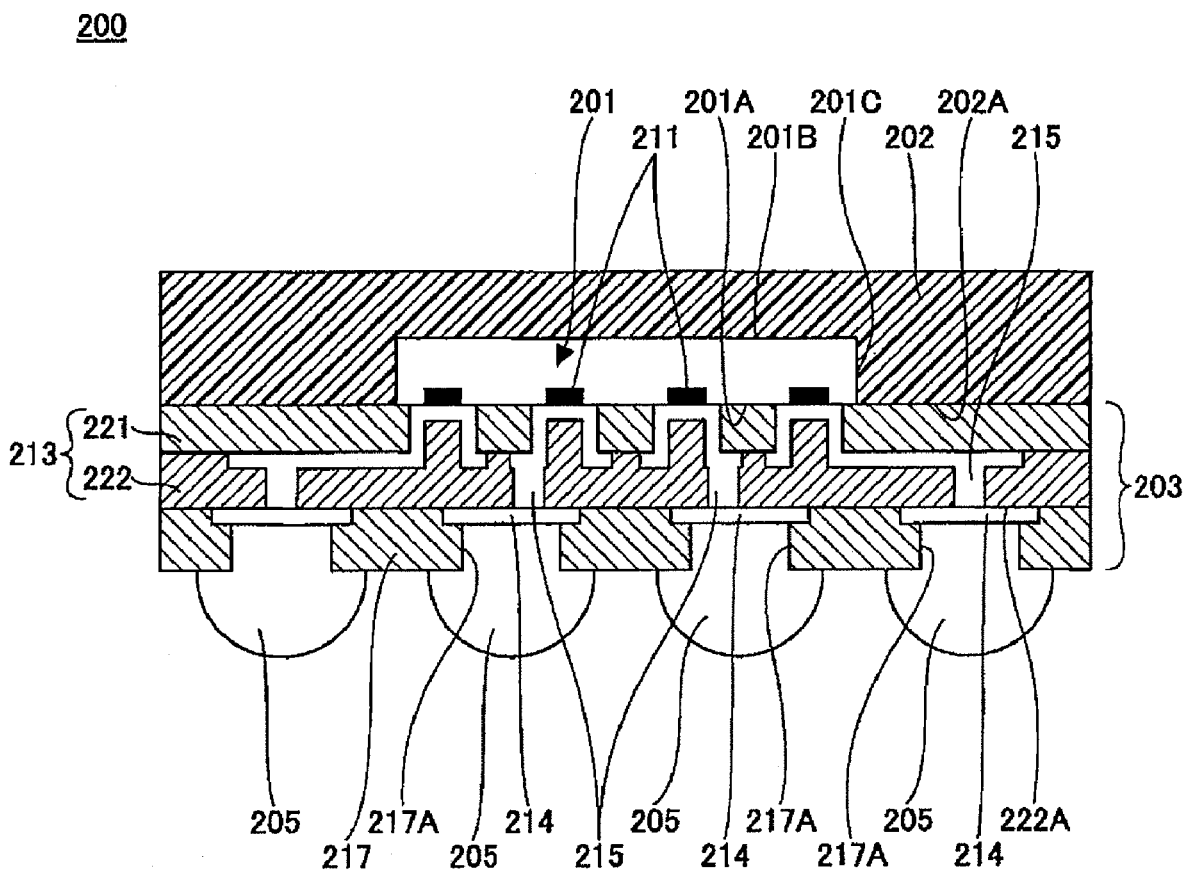
FIG. 1 is a cross-sectional view illustrating a related-art semiconductor device.
Figure 2:
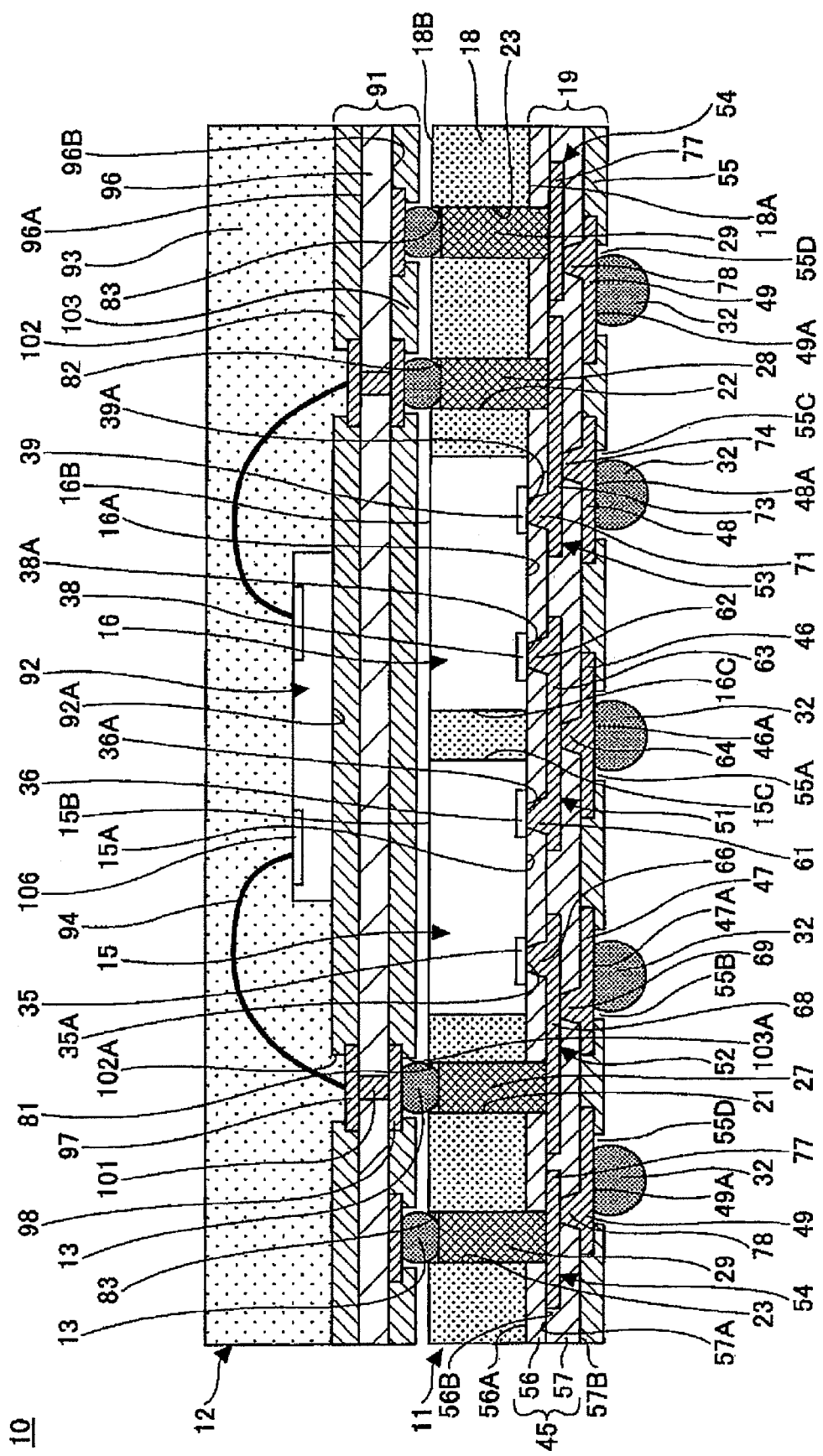
FIG. 2 is a cross-sectional view illustrating an electronic device according to an exemplary embodiment of the invention.

FIG. 2 is a cross-sectional view illustrating an electrode device according to an exemplary embodiment of the invention.

In FIG. 2, an electronic device 10 according to the exemplary embodiment has a first semiconductor device 11, a second semiconductor device 12 provided on the first semiconductor device 11 and electrically connected to the first semiconductor device 11, and internal connection terminals 13.

The first semiconductor device 11 has electronic components 15 and 16, a sealing resin 18, a multilayer wiring structure 19, through-holes 21 to 23, conductive members 27 to 29, and external connection terminals 32.

The electronic component 15 is a thin electronic component. The electronic component 15 has electrode pads 35 and 36 having contact faces 35A and 36A, an electrode pad forming face 15A on which the electrode pads 35 and 36 are formed, and a back face 15B opposite to the electrode pad forming face 15A.

A side face 15C of the electronic component 15 is covered and sealed up with the sealing resin 18. The electrode pad forming face 15A and the back face 15B of the electronic component 15 are exposed from the sealing resin 18. The electrode pad forming face 15A and the contact faces 35A and 36A are provided on a same plane, and are in contact with the multilayer wiring structure 19.

A thickness of the electronic component 15 is substantially the same as a thickness of the sealing resin 18. The thickness of the electronic component 15 may be, for example, about 300 μm.

For example, a semiconductor chip for a CPU may be used as the electronic component 15 with the above-described configuration.

The electronic component 16 is a thin electronic component. The electronic component 16 has electrode pads 38 and 39 having contact faces 38A and 39A, an electrode pad forming face 16A on which the electrode pads 38 and 39 are formed, and a back face 16B opposite to the electrode pad forming face 16A.

A side face 16C of the electronic component 16 is covered and sealed up with the sealing resin 18. The electrode pad forming face 16A and the back face 16B of the electronic component 16 are exposed from the sealing resin 18. The electrode pad forming face 16A and the contact faces 38A and 39A are provided on a same plane, and are in contact with the multilayer wiring structure 19.

A thickness of the electronic component 16 is substantially the same as a thickness of the sealing resin 18. The thickness of the electronic component 16 may be, for example, about 300 μm.

For example, a semiconductor chip for memory may be used as the electronic component 16 with the above-described configuration.

The sealing resin 18 is provided around the electronic components 15 and 16 to seal up the side face 15C and 16C of the electronic components 15 and 16. The sealing resin 18 exposes the electrode pad forming faces 15A and 16A and the back faces 15B and 16B.

The sealing resin 18 has a multilayer wiring structure forming face 18A and a face 18B. The multilayer wiring structure forming face 18A is a face, on which the multilayer wiring structure 19 is formed, and is in contact with the multilayer wiring structure 19. The multilayer wiring structure forming face 18A is provided on a same plane as a plane on which the electrode pad forming faces 15A and 16A are formed.

The face 18B of the sealing resin 18 is provided on a same plane as a plane on which the back faces 15B and 16B of the electronic components 15 and 16 are formed. The thickness of the sealing resin 18 is substantially the same as the thicknesses of the electronic components 15 and 16. When the thicknesses of the electronic components 15 and 16 are 300 μm, the thickness of the sealing resin 18 may be, for example, 300 μm.

For example, mold resin can be used as the sealing resin 18. For example, epoxy resin can be used as a raw material of the mold resin.

The multilayer wiring structure 19 has a stack portion 45, external connecting pads 46 to 49, wiring patterns 51 to 54, and a solder resist layer 55.

The stack portion 45 is formed by sequentially stacking an insulating layer 56 as a first insulating layer and an insulating layer 57 on the electrode pads 35, 36, 38, and 39, the electrode pad forming faces 15A and 16A, and the multilayer wiring structure forming face 18A of the sealing resin 18. A face 56A (first face of the first insulating layer, and face corresponding to the first face of the stack portion 45) of an insulating layer 56 is in contact with the electrode pads 35, 36, 38, and 39, the electrode pad forming faces 15A and 16A, and the multilayer wiring structure forming face 18A of the sealing resin 18. A face 57A of the insulating layer 57 is contact with a face 56B (second face of the first insulating layer) of the insulating layer 56 opposite to the face 56A. For example, insulating resin layers may be used as the insulating layers 56 and 57. For example, epoxy resin may be used as a raw material of the insulating resin layers.

A thickness of the insulating layer 56 may be, for example, 4 to 6 μm. A thickness of the insulating layer 57 may be, for example, 5 to 15 μm.

The external connecting pads 46 to 49 are provided on a face 57B (second face of the stack portion 45) of the insulating layer 57. The external connecting pads 46 to 49 respectively have contact faces 46A, 47A, 48A, and 49A on which an external connection terminal 32 is provided. For example, Cu may be used as a raw material of the external connecting pads 46 to 49.

The wiring pattern 51 has vias 61, 62, and 64, and a wiring 63. The via 61 is provided to pass through the insulating layer 56 at a part opposed to the electrode pad 36. One end of the via 61 is directly connected to the electrode pad 36 (specifically, contact face 36A) of the electronic component 15. The other end of the via 61 is configured integrally with the wiring 63. Accordingly, the via 61 electrically connects the electrode pad 36 to the wiring 63.

The via 62 is provided to pass through the insulating layer 56 at a part opposed to the electrode pad 38. One end of the via 62 is directly connected to the electrode pad 38 (specifically, contact face 38A). The other end of the via 62 is configured integrally with the wiring 63. Accordingly, the via 62 electrically connects the electrode pad 38 to the wiring 63.

The wiring 63 is provided on the face 56B of the insulating layer 56. The wiring 63 is configured integrally with the other ends of the vias 61 and 62. Accordingly, the wiring 63 electrically connects the electronic component 15 to the electronic component 16.

The via 64 is provided to pass through the insulating layer 57 at a part between the wiring 63 and the external connecting pad 46. One end of the via 64 is connected to the wiring 63, and the other end of the via 64 is configured integrally with the external connecting pad 46. Accordingly, the via 64 electrically connects the wiring 63 to the external connecting pad 46.

The wiring pattern 51 with the above-described configuration is directly connected to the electrode pads 36 and 38 of the electronic components 15 and 16 and the external connecting pad 46. For example, Cu may be used as a raw material of the wiring pattern 51.

The wiring pattern 52 has vias 66 and 69, and a wiring 68. The via 66 is provided to pass through the insulating layer 56 at a part opposed to the electrode pad 35. One end of the via 66 is directly connected to the electrode pad 35 (specifically, contact face 35A) of the electronic component 15. The other end of the via 66 is configured integrally with the wiring 68. Accordingly, the via 66 electrically connects the electrode pad 35 to the wiring 68.

The wiring 68 is provided on the face 56B of the insulating layer 56. The wiring 68 is configured integrally with the other end of the via 66, and is connected to a lower end of the conductive member 27. Accordingly, the wiring 68 electrically connects the electronic component 15 and the conductive member 27.

The via 69 is provided to pass through the insulating layer 57 at a part between the wiring 68 and the external connecting pad 47. One end of the via 69 is connected to the wiring 68, and the other end of the via 69 is configured integrally with the external connecting pad 47. Accordingly, the via 69 electrically connects the wiring 68 and the external connecting pad 47.

The wiring pattern 52 with the above-described configuration is directly connected to the electrode pad 35 of the electronic component 15, the conductive member 27, and the external connecting pad 47. For example, Cu may be used as a raw material of the wiring pattern 52.

The wiring pattern 53 has vias 71 and 74, and a wiring 73. The via 71 is provided to pass through the insulating layer 56 at a part opposed to the electrode pad 39. One end of the via 71 is directly connected to the electrode pad 39 (specifically, contact face 39A) of the electronic component 16. The other end of the via 71 is configured integrally with the wiring 73. Accordingly, the via 71 electrically connects the electrode pad 39 to the wiring 73.

The wiring 73 is provided on the face 56B of the insulating layer 56. The wiring 73 is configured integrally with the other end of the via 71, and is connected to a lower end of the conductive member 28. Accordingly, the wiring 73 electrically connects the electronic component 16 and the conductive member 28.

The via 74 is provided to pass through the insulating layer 57 at a part between the wiring 73 and the external connecting pad 48. One end of the via 74 is connected to the wiring 73, and the other end of the via 74 is configured integrally with the external connecting pad 48. Accordingly, the via 74 electrically connects the wiring 73 to the external connecting pad 48.

The wiring pattern 53 with the above-described configuration is electrically connected to the electrode pad 39 of the electronic component 16, the conductive member 28, and the external connecting pad 48. For example, Cu may be used as a raw material of the wiring pattern 53.

The wiring pattern 54 has a wiring 77 and a via 78. The wiring 77 is provided on the face 56B of the insulating layer 56. The wiring 77 is connected to a lower end of the conductive member 29.

The via 78 is provided to pass through the insulating layer 57 at a part between the wiring 77 and the external connecting pad 49. One end of the via 78 is connected to the wiring 77, and the other end of the via 78 is configured integrally with the external connecting pad 49. Accordingly, the via 78 electrically connects the wiring 77 and the external connecting pad 49.

The wiring pattern 54 with the above-described configuration is directly connected to the conductive member 29 and the external connecting pad 49. For example, Cu may be used as a raw material of the wiring pattern 54.

As described above, the sealing resin 18 has the face 18B provided on the same plane as the plane on which the back faces 1513 and 16B of the electronic components 15 and 16 are formed, are provided around the electronic components 15 and 16, and seals up the side faces 15C and 16C of the electronic components 15 and 16. The multilayer wiring structure 19 has the wiring patterns 51 to 53 provided in the stack portion 45 provided on the electronic pads 35, 36, 38, and 39 of the electronic components 15 and 16, the electrode pad forming faces 15A and 15B, and the multilayer wiring structure forming face 18A of the sealing resin 18. The electrode pads 35, 36, 38, and 39 are directly connected to the wiring patterns 51 to 53. Accordingly, it is possible to electrically connect the electronic components 15 and 16 to the multilayer wiring structure 19 without using a bump, and thus it is possible to reduce the size in thickness of the first semiconductor device 11.

A thickness of the multilayer wiring structure 19 with the above-described configuration is smaller than the thicknesses of the electronic components 15 and 16 and the thickness of the sealing resin 18. When the thicknesses of the electronic components 15 and 16 and the thickness of the sealing resin 18 are, for example, 300 µm, the thickness of the multilayer wiring structure 19 may be, for example, 20 to 80 µm.

The solder resist layer 55 is provided on the face 57B of the insulating layer 57. The solder resist layer 55 has opening portions 55A, 55B, 55C, and 55D. The opening portion 55A is formed to expose the contact face 46A of the external connecting pad 46. The opening portion 55B is formed to expose the contact face 47A of the external connecting pad 47. The opening portion 55C is formed to expose the contact face 48A of the external connecting pad 48. The opening portion 55D is formed to expose the contact face 49A of the external connecting pad 49.

The through-holes 21 to 23 are formed to pass through the sealing resin 18 and the insulating layer 56 at parts outside the areas where the electronic components 15 and 16 are provided. The through-hole 21 is formed to expose the wiring 68. The wiring 68 at a part exposed by the through-hole 21 constitutes a bottom of the through-hole 21.

The through-hole 22 is formed to expose the wiring 73. The wiring 73 at a part exposed by the through-hole 22 constitutes a bottom of the through-hole 22. The through-hole 23 is formed to expose the wiring 77. The wiring 77 at a part exposed by the through-hole 23 constitutes a bottom of the through-hole 23.

A diameter of the through-holes 21 to 23 with the above-described configuration may be, for example 200 µm. A depth of the through-holes 21 to 23 is substantially the same as a value obtained by adding the thickness of the sealing resin 18 to the thickness of the insulating layer 56. When the thickness of the sealing resin 18 is 300 µm and the thickness of the insulating layer 56 is 5 µm, the depth of the through-holes 21 to 23 may be, for example, 305 µm.

The conductive member 27 is provided in the through-hole 21. A lower end of the conductive member 27 is connected to the wiring 68 at the part exposed by the through-hole 21. An upper end of the conductive member 27 is connected to the internal connection terminal 13 electrically connected to the second semiconductor device 12. Accordingly, the conductive member 27 electrically connects the electrode component 15 and the multilayer wiring structure 19 to the second semiconductor device 12.

The conductive member 28 is provided in the through-hole 22. A lower end of the conductive member 28 is connected to the wiring 73 at the part exposed by the through-hole 22. An upper end of the conductive member 28 is connected to the internal connection terminal 13 electrically connected to the second semiconductor device 12. Accordingly, the conductive member 28 electrically connects the electronic component 16 and the multilayer wiring structure 19 to the second semiconductor device 12.

The conductive member 29 is provided in the through-hole 23. A lower end of the conductive member 29 is connected to the wiring 77 at the part exposed by the through-hole 23. An upper end of the conductive member 29 is connected to the internal connection terminal 13 electrically connected to the second semiconductor device 12. Accordingly, the conductive member 29 electrically connects the multilayer wiring structure 19 to the second semiconductor device 12.

As described above, the through-holes 21 to 23 passing through the sealing resin 18 and the insulating layer 56 and exposing the wirings 68, 73, and 77 are provided, and the through-holes 21 to 23 are provided with the conductive members 27 to 29 connected to the wirings 68, 73, and 77. Accordingly, it is possible to electrically connect the second semiconductor device 12 to the conductive members 27 to 29 through the internal connection terminals 13, and thus the second semiconductor device 12 can be mounted on the first semiconductor device 11.

A height of the conductive members 27 to 29 may be smaller than a value obtained by adding the thickness of the sealing resin 18 to the thickness of the insulating layer 56. When the thickness of the sealing resin 18 is 300 µm and the thickness of the insulating layer 56 is 5 µm, the height of the conductive members 27 to 29 may be, for example, 255 µm.

As described above, the height of the conductive members 27 to 29 is smaller than the value obtained by adding the thickness of the sealing resin 18 to the thickness of the insulating layer 56, and thus it is possible to form recessed portions 81 to 83 on the conductive members 27 to 29. Accordingly, it is possible to improve precision of positioning the second semiconductor device 12 with respect to the first semiconductor device 11 when the second semiconductor device 12 is mounted on the first semiconductor device 11.

Parts of the internal connection terminals 13 electrically connected to the second semiconductor device 12 can be accommodated in the recessed portions 81 to 83, respectively, and thus it is possible to reduce the size in thickness of the electronic device 10. When a diameter of the internal connection terminals 13 is 300 µm, a depth of the recessed portions 81 to 83 may be, for example, 50 µm.

Conductive paste may be used as a raw material of the conductive members 27 to 29. For example, solder, Ag paste, or the like may be used as the conductive paste.

Each of the external connection terminals 32 is provided on each of the contact faces 46A, 47A, 48A, and 49A of the external connecting pads 46 to 49. The external connection terminals 32 are terminals connected to pads (not shown) of a mounting board (not shown) such as a main board of the electronic device 10. For example, solder balls may be used as the external connection terminals 32. Metal posts, pin terminals, or the like may be used as the external connection terminals 32, instead of the solder balls.

According to the semiconductor device of the exemplary embodiment, the sealing resin 18 has the face 18B provided on the same plane as the plane on which the back faces 15B and 16B of the electronic components 15 and 16 are formed, are provided around the electronic components 15 and 16, and seals up the side faces 15C and 16C of the electronic components 15 and 16. The multilayer wiring structure 19 has the wiring patterns 51 to 53 provided in the stack portion 45 provided on the electronic pads 35, 36, 38, and 39 and the electrode pad forming faces 15A and 15B of the electronic components 15 and 16, and the multilayer wiring structure forming face 18A of the sealing resin 18 The electrode pads 35, 36, 38, and 39 are directly connected to the wiring patterns 51 to 53. Accordingly, it is possible to electrically connect the electronic components 15 and 16 to the multilayer wiring structure 19 without using a bump, and thus it is possible to reduce the size in thickness of the first semiconductor device 11.

The through-holes 21 to 23 passing through the sealing resin 18 and the insulating layer 56 and exposing the wirings 68, 73, and 77 are provided, and the through-holes 21 to 23 are provided with the conductive members 27 to 29 connected to the wirings 68, 73, and 77. Accordingly, it is possible to electrically connect the second semiconductor device 12 to the conductive members 27 to 29 through the internal connection terminals 13, and thus the second semiconductor device 12 can be mounted on the first semiconductor device 11.

The second semiconductor device 12 has a wiring board 91, and an electronic component 92, and a mold resin 93. The wiring board 91 has a substrate body 96, pads 97 and 98, a wiring pattern 101, and solder resist layers 102 and 103.

The substrate body 96 has a board shape. For example, a stack portion formed by stacking a plurality of insulating resin layers (e.g., epoxy resin layers) may be used as the substrate body 96.

The pad 97 is provided on an upper face 96A of the substrate body 96. The pad 97 is connected to one end of a metal wire 94 (e.g., Au wire) and an upper end of the wiring pattern 101. The pad 97 is electrically connected to the electronic component 92 through the metal wire 94. For example, Cu may be used as a raw material of the pad 97.

The pad 98 is provided on a lower face 96B of the substrate body 96. The pad 98 is connected to a lower end of the wiring pattern 101 and the internal connection terminal 13. The pad 98 is electrically connected to the pad 97 through the wiring pattern 101, and is electrically connected to the first semiconductor device 11 through the internal connection terminal 13. For example, Cu may be used as a raw material of the pad 98.

The wiring pattern 101 is provided in the substrate body 96 to pass through the substrate body 96. The wiring pattern 101 can be configured by, for example, a plurality of wires and vias (not shown). The upper end of the wiring pattern 101 is connected to the pad 97, and the lower end of the wiring pattern 101 is connected to the pad 98. For example, Cu may be used as a raw material of the wiring pattern 101.

The solder resist layer 102 is provided on the upper face 96A of the substrate body 96. The solder resist layer 102 has an opening portion 102A exposing the upper face of the pad 97.

The solder resist layer 103 is provided on the lower face 96B of the substrate body 96. The solder resist layer 103 has an opening portion 103A exposing the lower face of the pad 98.

The electronic component 92 has a plurality of electrode pads 106. The electronic component 92 is adhered onto the solder resist layer 102 such that the face 92A of the electronic component 92 where the electrode pads 106 are not formed is in contact with the upper face of the solder resist layer 102. The electrode pads 106 are connected to the other ends of the metal wires 94. Accordingly, the electronic component 92 is electrically connected to the wiring board 91 through the metal wires 94. For example, a semiconductor chip for graphics may be used as the electronic component 92.

The mold resin 93 is provided on the upper face of the pad 97 and the upper face of the solder resist layer 102 to cover the electronic component 92 and the metal wires 94. The mold resin 93 is resin for sealing up the electronic component 92 and the metal wires 94. For example, epoxy resin may be used as a raw material of the mold resin 93.

The internal connection terminals 13 are provided between the upper ends of the conductive members 27 to 29 of the first semiconductor device 11 and the pads 98 of the second semiconductor device 12. The internal connection terminal 13 is connected to the upper end of any one conductive member of the conductive members 27 to 29 and the pad 98. Accordingly, the second semiconductor device 12 is electrically connected to the first semiconductor device 11. For example, solder balls may be used as the internal connection terminals 13.

The face (specifically, the back faces 1513 and 16B of the electronic components 15 and 16, and the face 1813 of the sealing resin 18 provided on the same plane) of the first semiconductor device 11 on the side connected to the second semiconductor device 12 is a flat face, and thus it is possible to reduce a diameter of the internal connection terminals 13. The diameter of the internal connection terminals 13 may be, for example, 300 µm.

According the electronic component of the exemplary embodiment, the second semiconductor device 12 is provided to be opposed to the back faces 15B and 16B of the electronic components 15 and 16, and the face 18B of the sealing resin 18 provided on the same plane, and the first semiconductor device 11 is electrically connected to the second semiconductor device 12 through the internal connection terminals 13 provided between the first semiconductor device 11 and the second semiconductor device 12. Accordingly, it is possible to reduce the diameter (specifically, height) of the internal connection terminals 13, and thus it is possible to reduce the size in thickness of the electronic device 10.

Since the diameter of the internal connection terminals 13 is small, it is possible to dispose the conductive members 27 to 29 at small pitches. Accordingly, it is possible to increase the number of terminals between the first and second semiconductor devices 11 and 12.

Further, since the conductive members 27 to 29 are provided at the small pitches, it is possible to reduce the size in plane of the first and second semiconductor devices 11 and 12 and the electronic device 10.

In the exemplary embodiment, the case where the height of the conductive members 27 to 29 is smaller than the value obtained by adding the thickness of the sealing resin 18 to the thickness of the insulating layer 56 has been described, but the height of the conductive member 27 to 29 may be substantially the same as the value obtained by adding the thickness of the sealing resin 18 to the thickness of the insulating layer 56. The upper ends of the conductive members 27 to 29 may be configured to protrude from the face 18B of the sealing resin 18.

FIG. 3 to FIG. 18 are views illustrating a process of producing the electronic device according to the exemplary embodiment. In FIG. 3 to FIG. 18, the same reference numerals and signs are given to the same constituent parts as those of the electronic device 10 according to the exemplary embodiment.

The method of producing the electronic device 10 according to the exemplary embodiment will be described with reference to FIG. 3 to FIG. 18. A process of producing the first semiconductor device 11 will be also described while describing the method of producing the electronic device 10.

Figure 3:
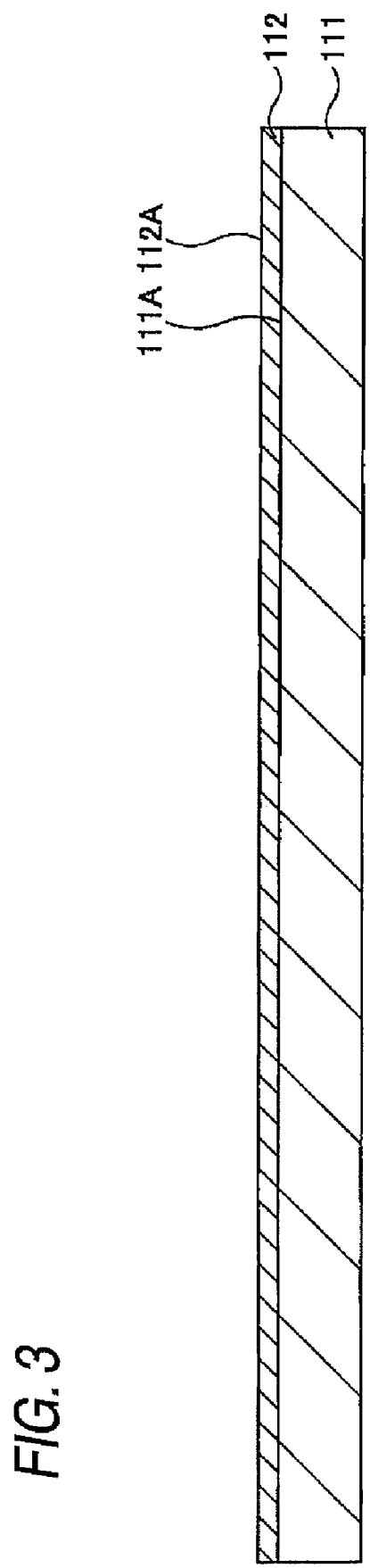
FIG. 3 is a first view illustrating a process of producing the electronic device according to the exemplary embodiment.

First, in the process shown in FIG. 3, an adhesive 112 is formed on a face 111A of a supporter 111. For example, a silicon substrate, a metal plate (e.g., Cu plate), a glass board, or the like may be used as the supporter 111. A thickness of the supporter 111 may be, for example, 300 µm. For example, epoxy resin may be used as the adhesive 112. In this case, a thickness of the adhesive 112 may be, for example, 20 µm.

Figure 4:
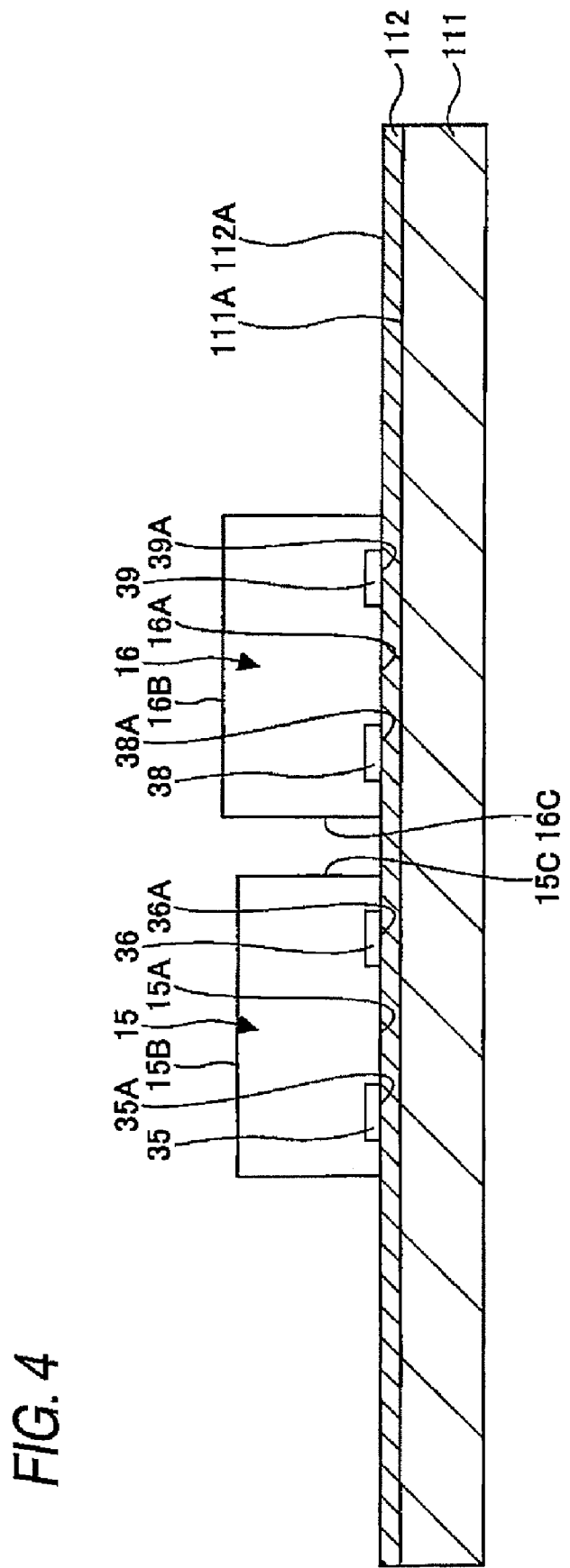
FIG. 4 is a second view illustrating the process of producing the electronic device according to the exemplary embodiment.

Next, in the process shown in FIG. 4, the electronic components 15 and 16 are bonded to the adhesive 112 so that the electrode pad forming faces 15A and 16A and the electrode pads 35, 36, 38, and 39 come into contact with the face 112A of the adhesive 112. In this step, the electronic components 15 and 16 are not made thin. The thickness of the electronic components 15 and 16 in this step may be, for example, 500 µm. For example, a semiconductor chip for a CPU may be used as the electronic component 15. For example, a semiconductor chip for memory may be used as the electronic component 16.

Figure 5:
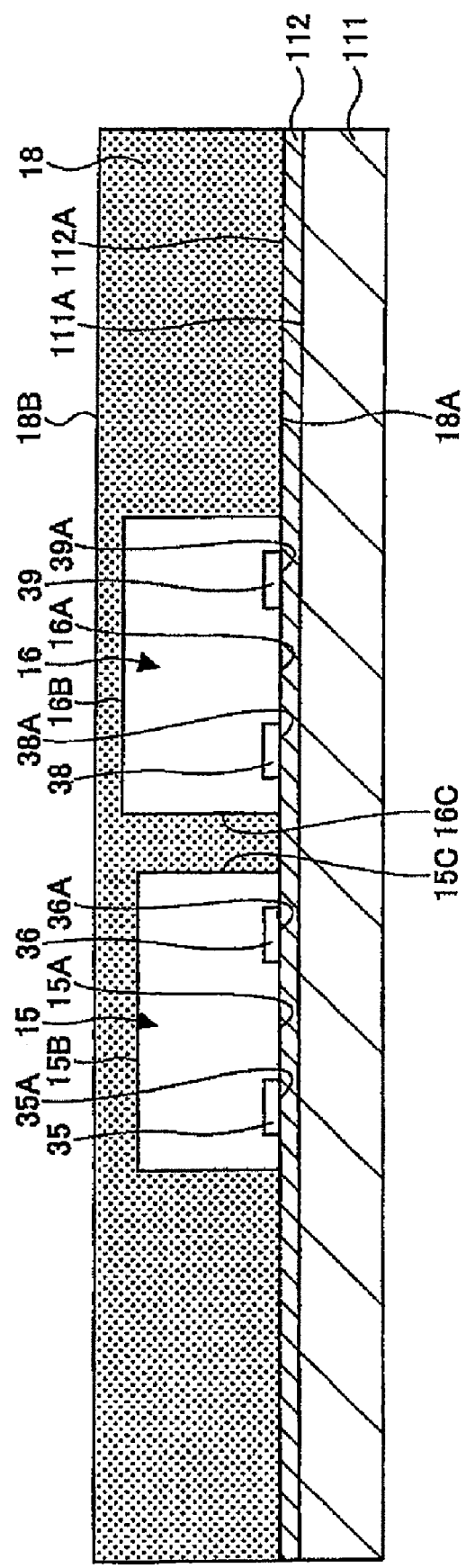
FIG. 5 is a third view illustrating the process of producing the electronic device according to the exemplary embodiment.

Next, in the process shown in FIG. 5, the sealing resin 18 covering the back faces 15B and 16B of the electronic components 15 and 16 and the side faces 15C and 16C and having the multilayer wiring structure forming face 18A is formed on the face 112A of the adhesive 112. Specifically, the sealing resin 18 may be formed by a method of potting resin or a transfer mold method. For example, epoxy resin may be used as a raw material of the sealing resin 18.

In this step, the thickness of the sealing resin 18 is larger than the thickness of the sealing resin 18 shown in FIG. 2 as described above. When the thickness of the electronic components 15 and 16 is 500 μm, the thickness of the sealing resin 18 in this step may be, for example, 600 μm. In this step, the back faces 15B and 16B of the electronic components 15 and 16 and the face 18B of the sealing resin 18 are not provided on the same plane.

Figure 6:
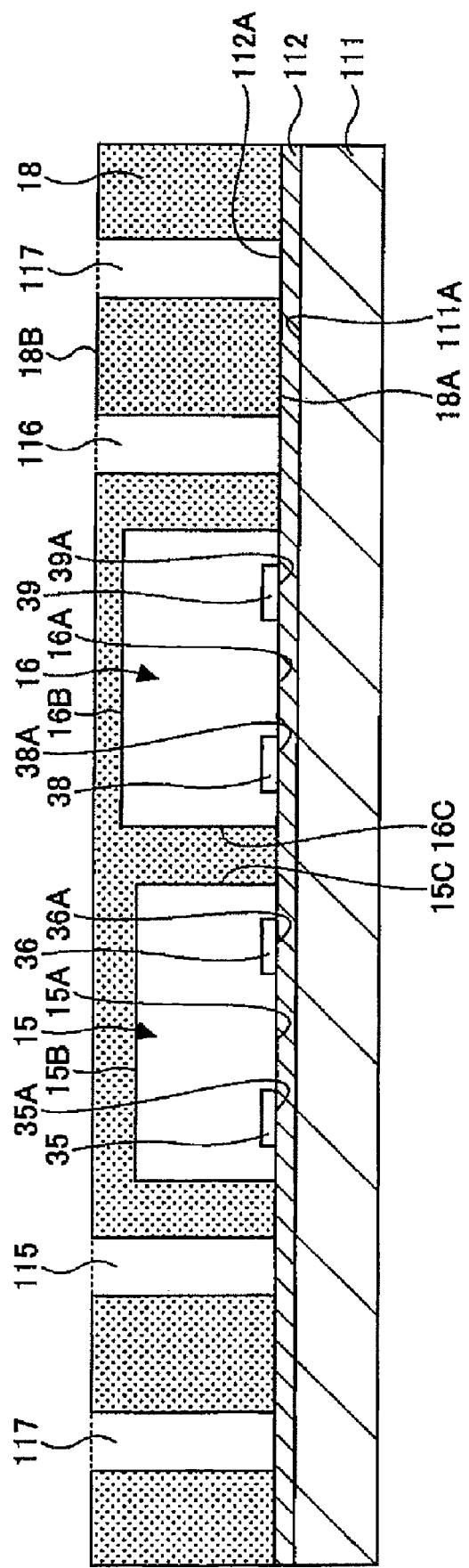
FIG. 6 is a fourth view illustrating the process of producing the electronic device according to the exemplary embodiment.

Next, in the process shown in FIG. 6, opening portions 115 to 117 are formed, which pass through the sealing resin 18 at the parts corresponding to the areas where the conductive members 27 to 29 are formed. The opening portions 115 to 117 may be formed by, for example, a drill or laser process, or the like. A diameter of the opening portions 115 to 117 may be, for example, 200 μm. The opening portion 115 is an opening portion to be a part of the through-hole 21 described with reference to FIG. 2. The opening portion 116 is an opening portion to be a part of the through-hole 22 described with reference to FIG. 2. The opening portion 117 is an opening portion to be a part of the through-hole 23 described with reference to FIG. 2.

In FIG. 6, the case of forming the opening portions 115 to 117 to expose the face 112A of the adhesive 112 has been described, but the opening portions 115 to 117 may be formed to pass through the sealing resin 18 and the adhesive 112.

Figure 7:
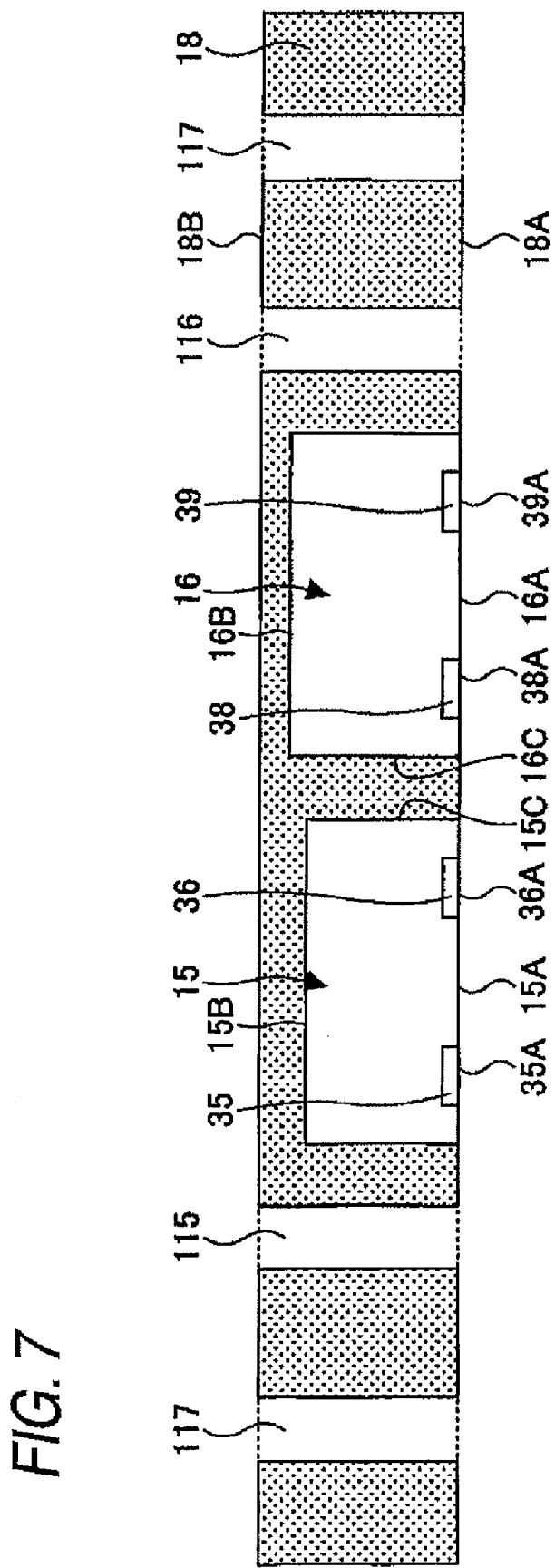
FIG. 7 is a fifth view illustrating the process of producing the electronic device according to the exemplary embodiment.

Next, in the process shown in FIG. 7, the supporter 111 and the adhesive 112 are removed from the structure shown in FIG. 6. Specifically, the supporter 111 is peeled off from the structure shown in FIG. 6, thereby removing the adhesive 112 with the supporter 111.

Figure 8:
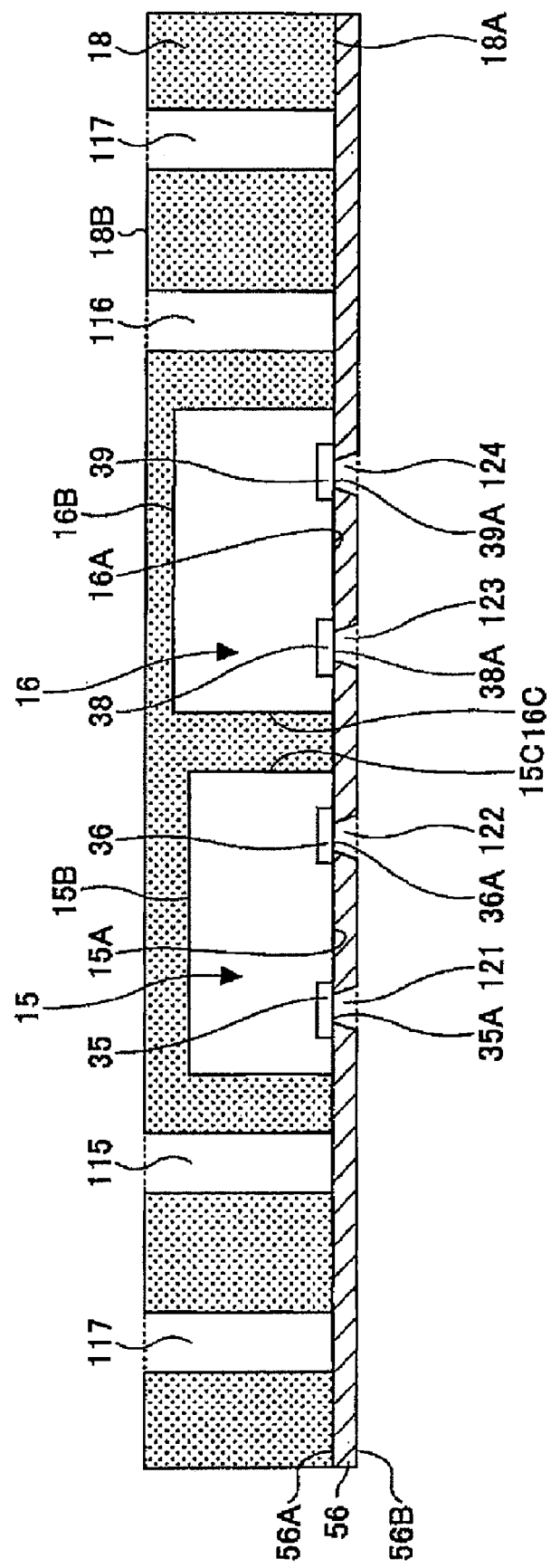
FIG. 8 is a sixth view illustrating the process of producing the electronic device according to the exemplary embodiment.

Next, in the process shown in FIG. 8, the insulating layer 56 (first insulating layer) having opening portions 121 to 124 is formed on the electrode pad forming faces 15A and 16A of the electronic components 15 and 16, the electrode pads 35, 36, 38, and 39, and the multilayer wiring structure forming face 18A of the sealing resin 18, respectively.

Specifically, for example, a resin sheet (base material of the insulating layer 56) made of epoxy resin is attached to cover the electrode pad forming face 15A and 16A, the electrode pads 35, 36, 38, and 39, and the multilayer wiring structure forming face 18A. Accordingly, lower ends of the opening portions 115 to 117 can be filled with the resin sheet. Next, for example, the resin sheet at the parts corresponding to the areas where the opening portions 121 to 124 are formed is subjected to a laser process, and thus the insulating layer 56 having the opening portions 121 to 124 can be formed. The thickness of the insulating layer 56 may be, for example, 4 to 16 μm.

The opening portions 121 to 124 are formed to pass through the insulating layer 56. The opening portion 121 is formed to expose the contact face 35A of the electrode pad 35. The opening portion 122 is formed to expose the contact face 36A of the electrode pad 36. The opening portion 123 is formed to expose the contact face 38A of the electrode pad 38. The opening portion 124 is formed to expose the contact face 39A of the electrode pad 39.

Figure 9:
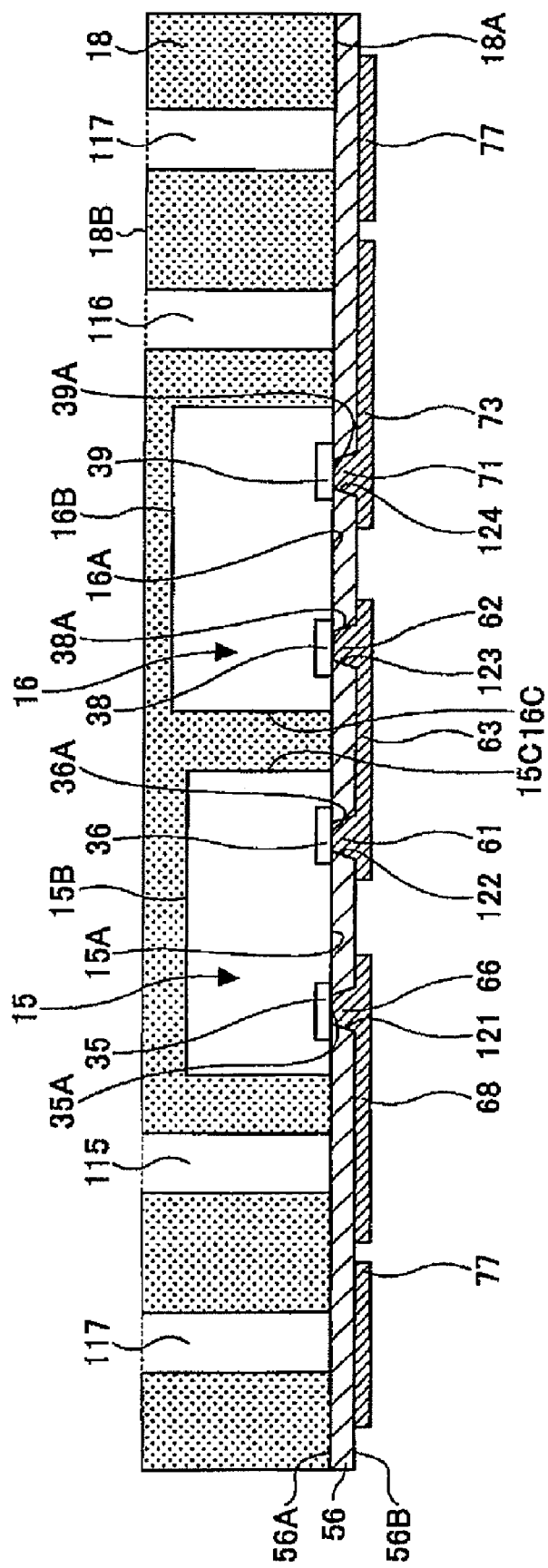
FIG. 9 is a seventh view illustrating the process of producing the electronic device according to the exemplary embodiment.

Next, in the process shown in FIG. 9, the vias 61, 62, 66, and 71, and the wirings 63, 68, 73, 77 are formed at once. Specifically, the vias 61, 62, 66, and 71, and the wirings 63, 68, 73, and 77 are formed by, for example, a semi-additive method. For example, Cu may be used as a raw material of the vias 61, 62, 66, and 71, and the wirings 63, 68, 73, and 77.

The via 61 is formed at the opening portion 122 to come into direct contact with the contact face 36A of the electrode pad 36. The via 62 is formed at the opening portion 123 to come into direct contact with the contact face 38A of the electrode pad 38. The wiring 63 is formed on the face 56B of the insulating layer 56 to be configured integrally with the vias 61 and 62.

The via 66 is formed at the opening portion 121 to come into direct contact with the contact face 35A of the electrode pad 35. The wiring 68 is formed on the face 56B of the insulating layer 56 to be opposed to the opening portion 115 through the insulating layer 56 and configured integrally with the via 66.

The via 71 is formed at the opening portion 124 to come into direct contact with the contact face 39A of the electrode pad 39. The wiring 73 is formed on the face 56B of the insulating layer 56 to be opposed to the opening portion 116 through the insulating layer 56 and configured integrally with the via 71. The wiring 77 is formed on the face 56B of the insulating layer 56 to be opposed to the opening portion 117 through the insulating layer 56.

As described above, the electrode pads 35, 36, 38, and 39 are directly connected to the vias 61, 62, 66, and 71, and thus it is possible to electrically connect the electronic components 15 and 16 to the multilayer wiring structure 19 without using a bump. Accordingly, it is possible to reduce the size in thickness of the first semiconductor device 11.

Figure 10:
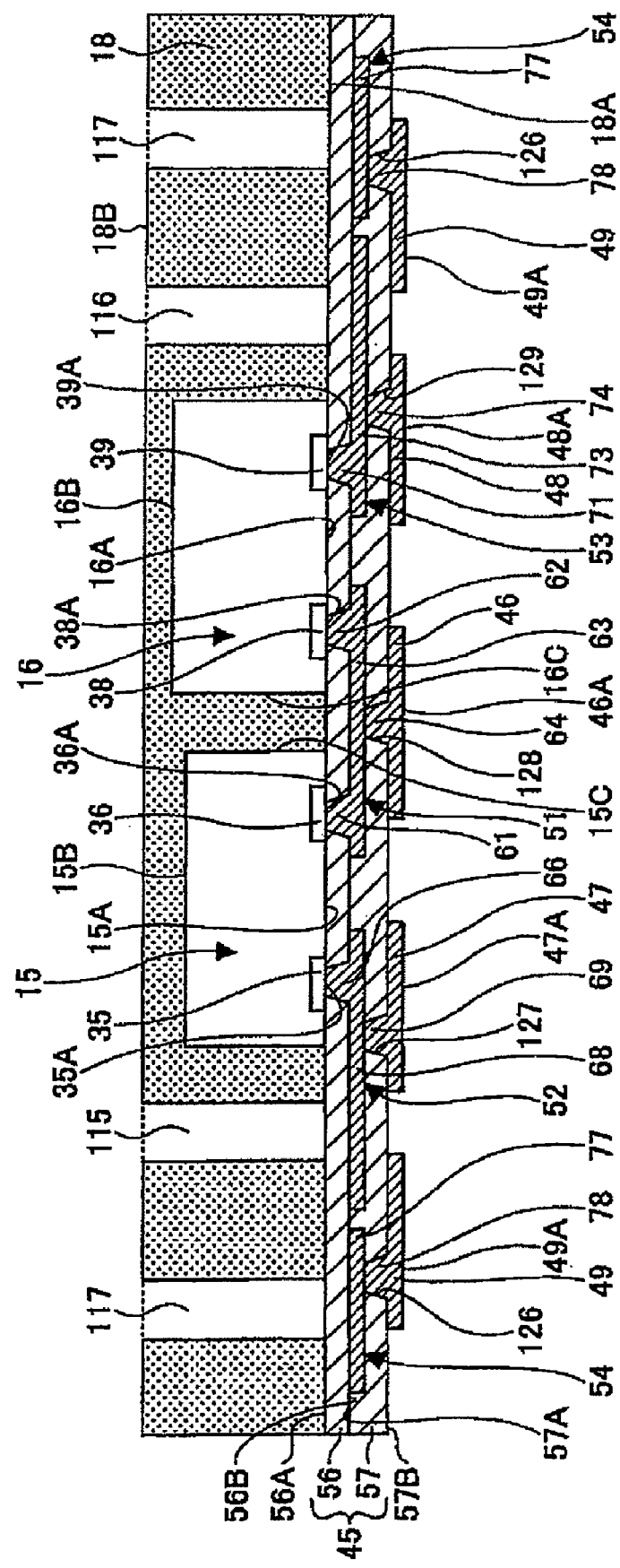
FIG. 10 is an eighth view illustrating the process of producing the electronic device according to the exemplary embodiment.

Next, in the process shown in FIG. 10, the insulating layer 57 having opening portions 126 to 129 is formed on the face 56B of the insulating layer 56 where the wirings 63, 68, 73, and 77 are formed. Accordingly, the stack portion 45 including the insulating layers 56 and 57 is formed.

The insulating layer 57 having the opening portions 126 to 129 is formed by performing the same process as the process shown in FIG. 8. The opening portion 126 is formed to pass through the insulating layer 57 and to expose a part of the wiring 77. The opening portion 127 is formed to pass through the insulating layer 57 and to expose a part of the wiring 68. The opening portion 128 is formed to pass through the insulating layer 57 and to expose a part of the wiring 63. The opening portion 129 is formed to pass through the insulating layer 57 and to expose a part of the wiring 73. The thickness of the insulating layer 57 may be, for example, 5 to 15 μm.

Next, the vias 64, 69, 74, and 78, and the external connecting pads 46 to 49 respectively having connection portions 46A, 47A, 48A, and 49A are formed at once.

Specifically, for example, the vias 64, 69, 74, and 78, and the external connecting pads 46 to 49 are formed at once by performing the same process as the process shown in FIG. 9. Accordingly, the wiring patterns 51 to 54 provided in the stack portion 45 are formed. For example, Cu may be used as a raw material of the vias 64, 69, 74, and 78, and the external connecting pads 46 to 49.

The via 64 is formed at the opening portion 128 to come into contact with the wiring 63. The external connecting pad 46 is formed on the face 57B of the insulating layer 57 to be configured integrally with the via 64. The via 69 is formed at the opening portion 127 to come into contact with the wiring 68. The external connecting pad 47 is formed on the face 57B of the insulating layer 57 to be configured integrally with the via 69.

The via 74 is formed at the opening portion 129 to come into contact with the wiring 73. The external connecting pad 48 is formed on the face 57B of the insulating layer 57 to be configured integrally with the via 74. The via 78 is formed at the opening portion 126 to come into contact with the wiring 77. The external connecting pad 49 is formed on the face 57B of the insulating layer 57 to be configured integrally with the via 78.

Figure 11:
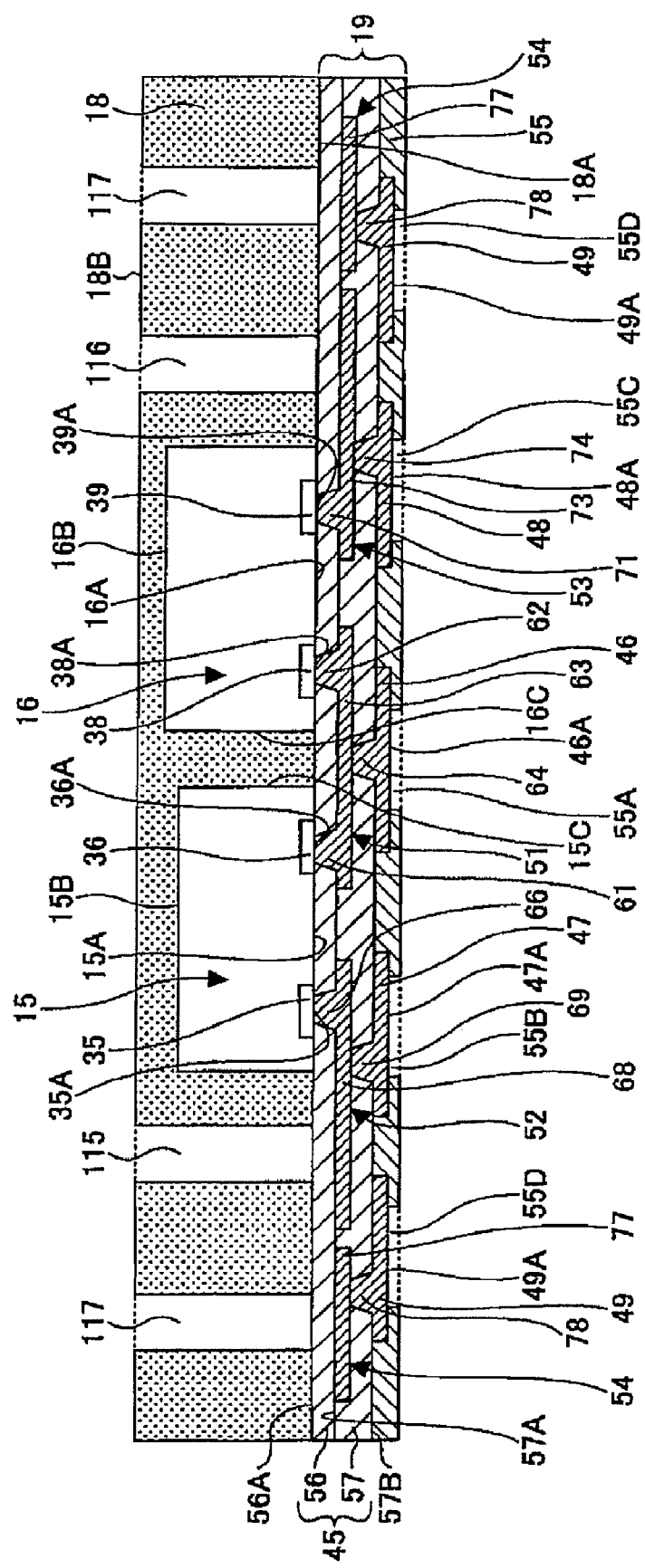
FIG. 11 is a ninth view illustrating the process of producing the electronic device according to the exemplary embodiment.

Next, in the process shown in FIG. 11, the solder resist layer 55 having the opening portions 55A, 55B, 55C, and 55D is formed on the face 57B of the insulating layer 57. Accordingly, the multilayer wiring structure 19 provided with the stack portion 45, the external connecting pads 46 to 49, the wiring patterns 51 to 54, and the solder resist layer 55 are formed.

The opening portion 55A is formed to expose the contact face 46A. The opening portion 55B is formed to expose the contact face 47A. The opening portion 55C is formed to expose the contact face 48A. The opening portion 55D is formed to expose the contact face 49A. The thickness of the multilayer wiring structure 19 may be, for example, 20 to 80 μm.

Figure 12:
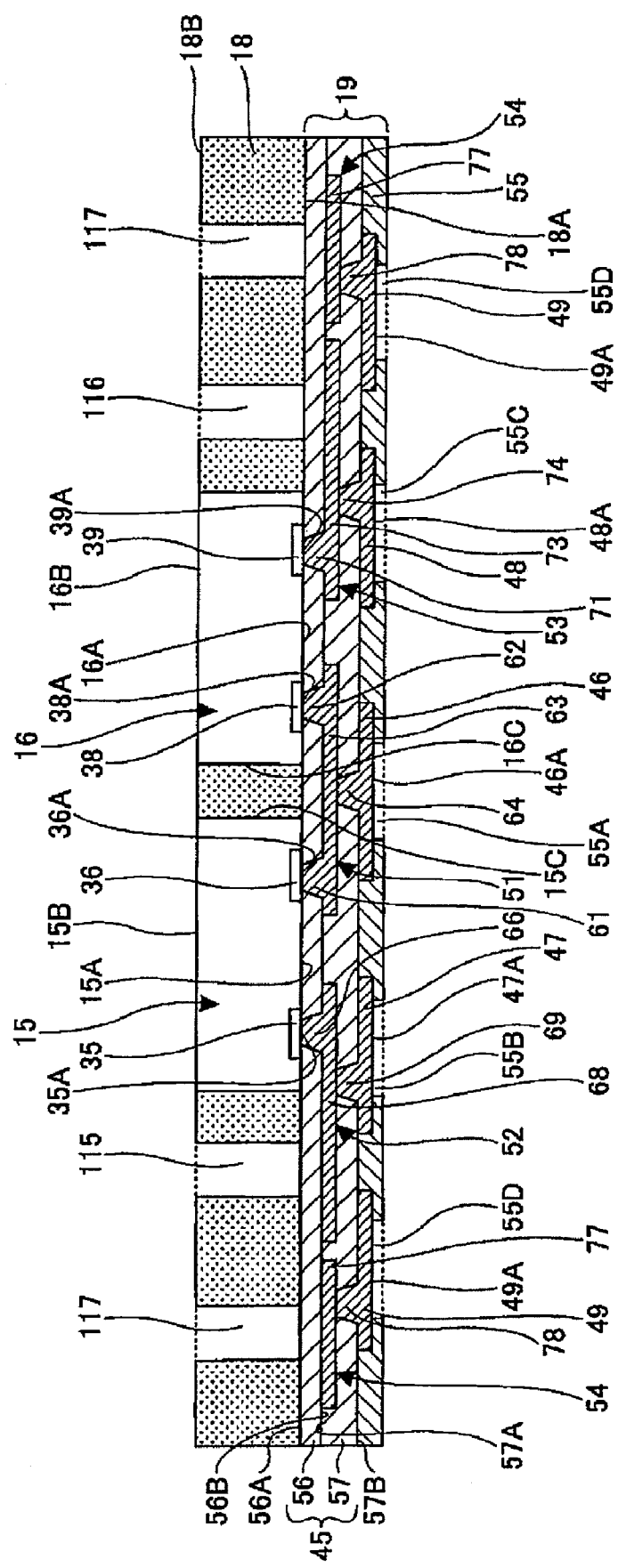
FIG. 12 is a tenth view illustrating the process of producing the electronic device according to the exemplary embodiment.

Next, in the process shown in FIG. 12, the sealing resin 18 and the electronic components 15 and 16 are grinded (e.g., grinded using a backside grinder) so that the back faces 15B and 16B of the electronic components 15 and 16 and the face 18B of the sealing resin 18 are on the same plane, thereby making the electronic components 15 and 16 thin.

Accordingly, the thicknesses of the electronic components 15 and 16 and the sealing resin 18 become small, and thus it is possible to reduce the size in thickness of the first semiconductor device 11.

The face (the back faces 15B and 16B of the electronic components 15 and 16 and the face 18B of the sealing resin 18 provided on the same plane) of the first semiconductor device 11 on the side opposed to the second semiconductor device 12 is made into a flat face, and thus it is possible to reduce the diameter of the internal connection terminals 13 electrically connecting the first semiconductor device 11 to the second semiconductor device 12. Accordingly, it is possible to reduce the size in thickness of the electronic device 10.

The diameter of the internal connection terminals 13 is reduced and thus it is possible to increase the number of terminals (the number of internal connection terminals 13) provided between the first semiconductor device 11 and the second semiconductor device 12.

The thickness of the electronic components 15 and 16 made thin and the thickness of the grinded sealing resin 18 are larger than the thickness (e.g., 20 to 80 μm) of the multilayer wiring structure 19. The thickness of the electronic components 15 and 16 made thin and the thickness of the grinded sealing resin 18 are substantially the same. The thickness of the electronic components 15 and 16 made thin and the thickness of the grinded sealing resin 18 may be, for example, 300 μm. In this step, the depth of the opening portions 115 to 117 may be, for example, 300 μm.

Figure 13:
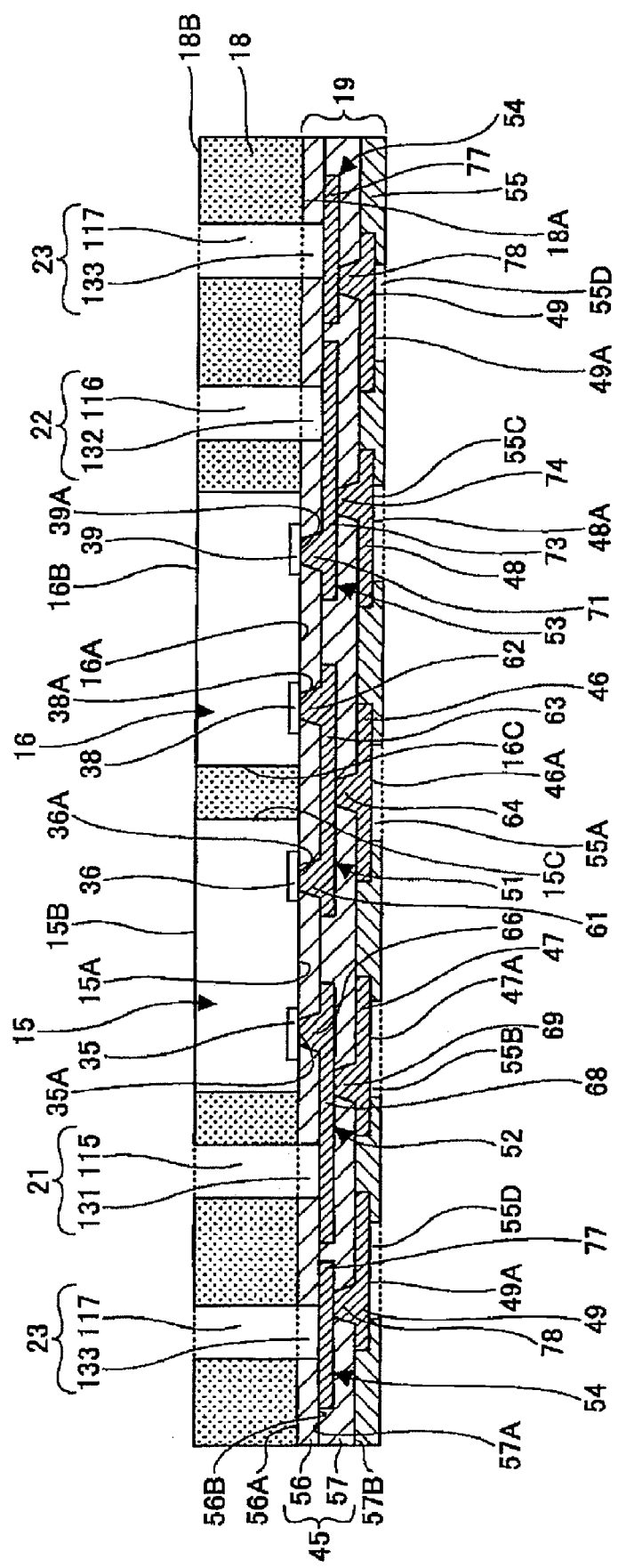
FIG. 13 is an eleventh view illustrating the process of producing the electronic device according to the exemplary embodiment.

Next, in the process shown in FIG. 13, opening portions 131 to 133 are formed in the insulating layer 56 at the parts exposed by the opening portions 115 to 117, respectively. The opening portion 131 is formed to pass through the insulating layer 56 and to expose the wiring 68. The opening portion 132 is formed to pass through the insulating layer 56 and to expose the wiring 73. The opening portion 133 is formed to pass through the insulating layer 56 and to expose the wiring 77.

Specifically, for example, the opening portions 131 to 133 are formed by performing a plasma etching or laser process on the insulating layer 56 at the parts exposed by the opening portions 115 to 117. Accordingly, the through-hole 21 formed of the opening portions 115 and 131, the through-hole 22 formed of the opening portions 116 and 132, and the through-hole 23 formed of the opening portions 117 and 133 are formed.

Figure 14:
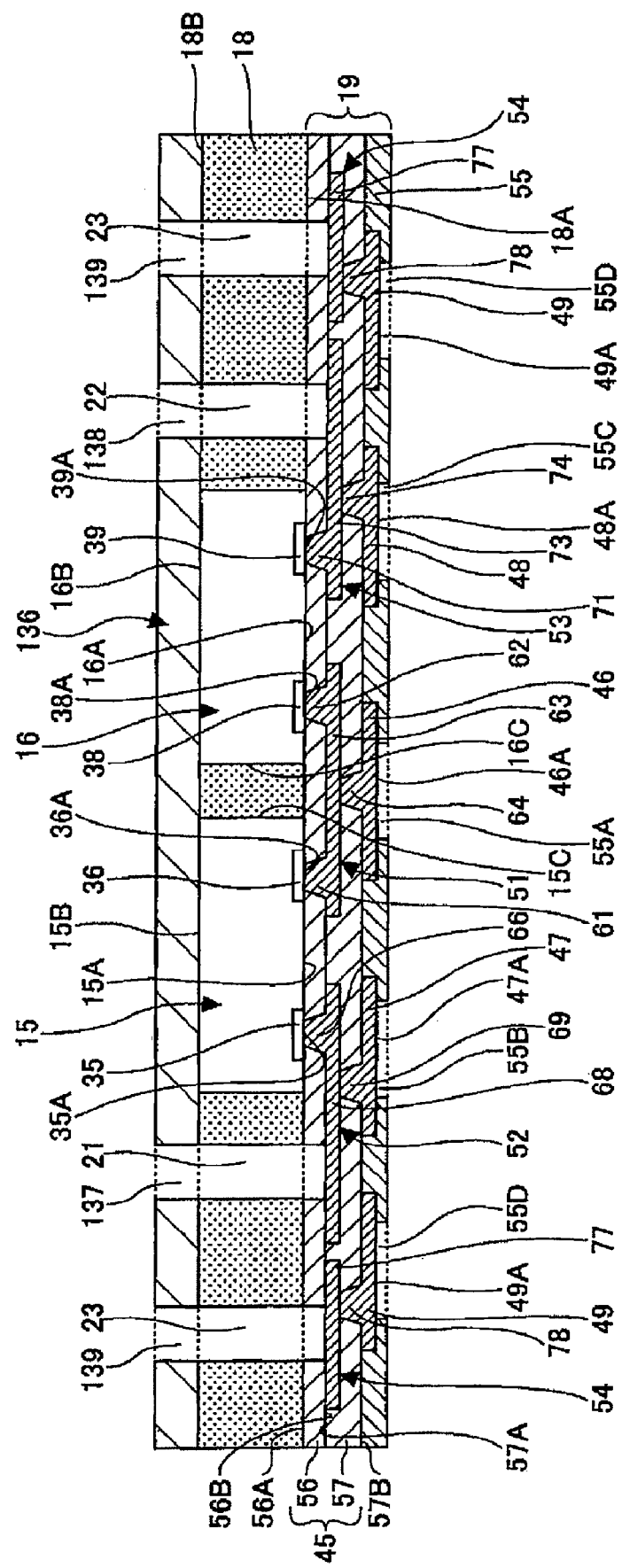
FIG. 14 is a twelfth view illustrating the process of producing the electronic device according to the exemplary embodiment.

Next, in the process shown in FIG. 14, a printing mask 136 having through-holes 137 to 139 is provided on the back faces 15B and 16B of the electronic components 15 and 16 and the face 18B of the sealing resin 18. In this case, the printing mask 136 is arranged to allow the through-hole 137 to expose the through-hole 21, to allow the through-hole 138 to expose the through-hole 22, and to allow the through-hole 139 to expose the through-hole 23.

A metal material (e.g., stainless) may be used as a raw material of the printing mask 136. A thickness of the printing mask 136 may be, for example, 200 μm. A diameter of the through-holes 137 to 139 is substantially the same as the diameter of the through-holes 21 to 23. The diameter of the through-holes 137 to 139 may be, for example, 200 μm.

Figure 15:
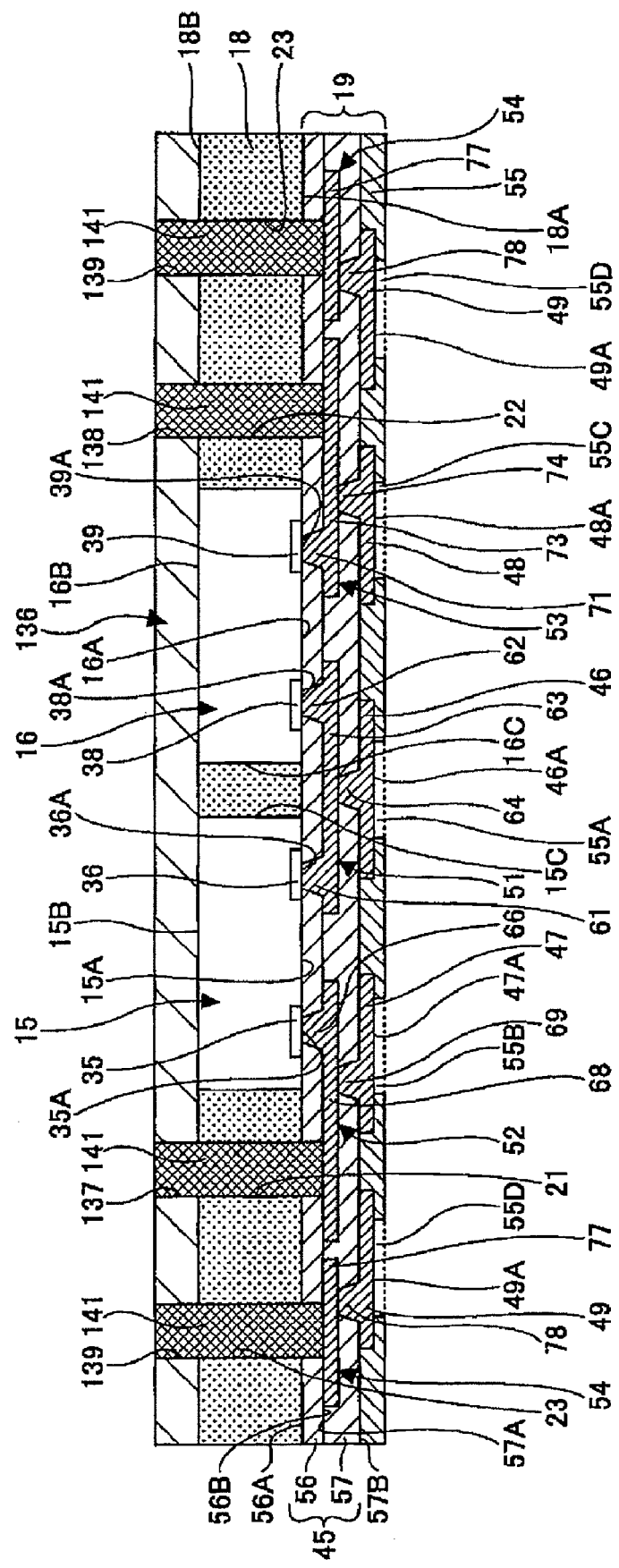
FIG. 15 is a thirteenth view illustrating the process of producing the electronic device according to the exemplary embodiment.

Next, in the process shown in FIG. 15, the through-holes 21 to 23 and 137 to 139 are filled with conductive paste 141 as a base material of the conductive members 27 to 29 by a printing method (e.g., squeegee printing method). For example, solder, Ag paste, or the like may be used as the conductive paste 141.

Figure 16:
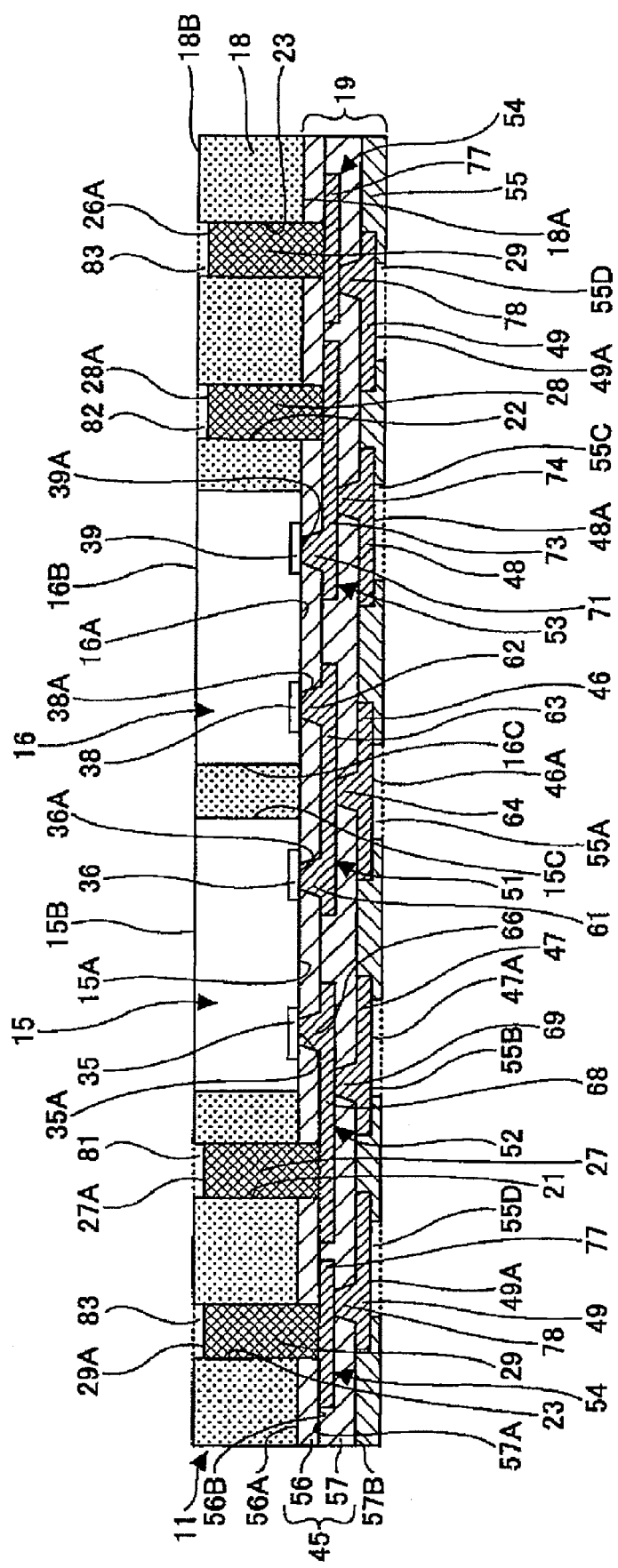
FIG. 16 is a fourteenth view illustrating the process of producing the electronic device according to the exemplary embodiment.

Next, in the process shown in FIG. 16, the printing mask 136 is removed, and the conductive paste 141 shown in FIG. 15 is subjected to a reflow process, and thus the conductive members 27 to 29 are formed in the through-holes 21 to 23.

The conductive member 27 is connected to the wiring 68 which is one of constituent elements of the wiring pattern 52. The conductive member 28 is connected to the wiring 73 which is one of constituent elements of the wiring pattern 53. The conductive member 29 is connected to the wiring 77 which is one of constituent elements of the wiring pattern 54.

As described above, the conductive members 27 to 29 connected to the wiring patterns 52 to 54 are formed in the through-holes 2'1 to 23 passing through the sealing resin 18, and thus the conductive members 27 to 29 can be electrically connected to the second semiconductor device 12 through the internal connection terminals 13. Accordingly, it is possible to mount the second semiconductor device 12 on the first semiconductor device 11.

The conductive paste 141 is subjected to the reflow process, and thus a volume of the conductive paste 141 shown in FIG. 15 is decreased. Accordingly, contact faces 27A, 28A, and 29A of the conductive members 27 to 29 connected to the internal connection terminals 13 are provided lower than the face 1813 of the sealing resin 18. Therefore, the recessed portions 81 to 83 accommodating parts of the internal connection terminals 13 are formed on the contact faces 27A, 28A, and 29A.

As described above, the recessed portions 81 to 83 are formed above the contact faces 27A, 28A, and 29A of the conductive members 27 to 29, and thus it is possible to improve precision of positioning the second semiconductor device 12 with respect to the first semiconductor device 11 when the second semiconductor device 12 is mounted on the first semiconductor device 11.

Further, since it is possible to accommodate the parts of the internal connection terminals 13 electrically connected to the second semiconductor device 12 in the recessed portions 81 to 83, it is possible to reduce the size in thickness of the electronic device 10.

The height of the conductive members 27 to 29 may be, for example, 255 μm. The depth of the recessed portions 81 to 83 may be, for example, 50 μm.

Figure 17:
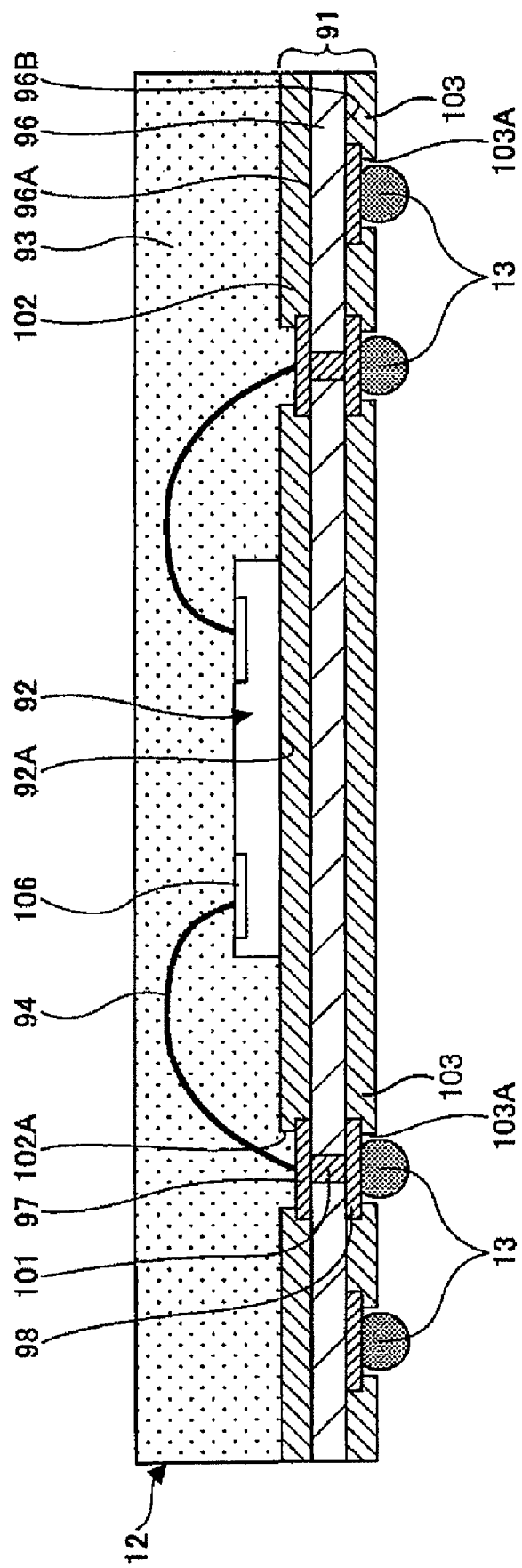
FIG. 17 is a fifteenth view illustrating the process of producing the electronic device according to the exemplary embodiment.

Next, in the process shown in FIG. 17, the second semiconductor device 12 provided with the wiring board 91, the electronic component 92, and the mold resin 93 are formed by a known method, and then the internal connection terminals 13 are formed on the pads 98 of the second semiconductor device 12.

As described above, since the face (specifically, the back faces 15B and 16B of the electronic components 15 and 16, and the face 18B of the sealing resin 18) of the first semiconductor device 11 on the side where the second semiconductor device 12 is mounted is the flat face provided on the same plane, it is possible to reduce the diameter of the internal connection terminals 13. The diameter of the internal connection terminals 13 may be, for example, 300 μm.

Figure 18:
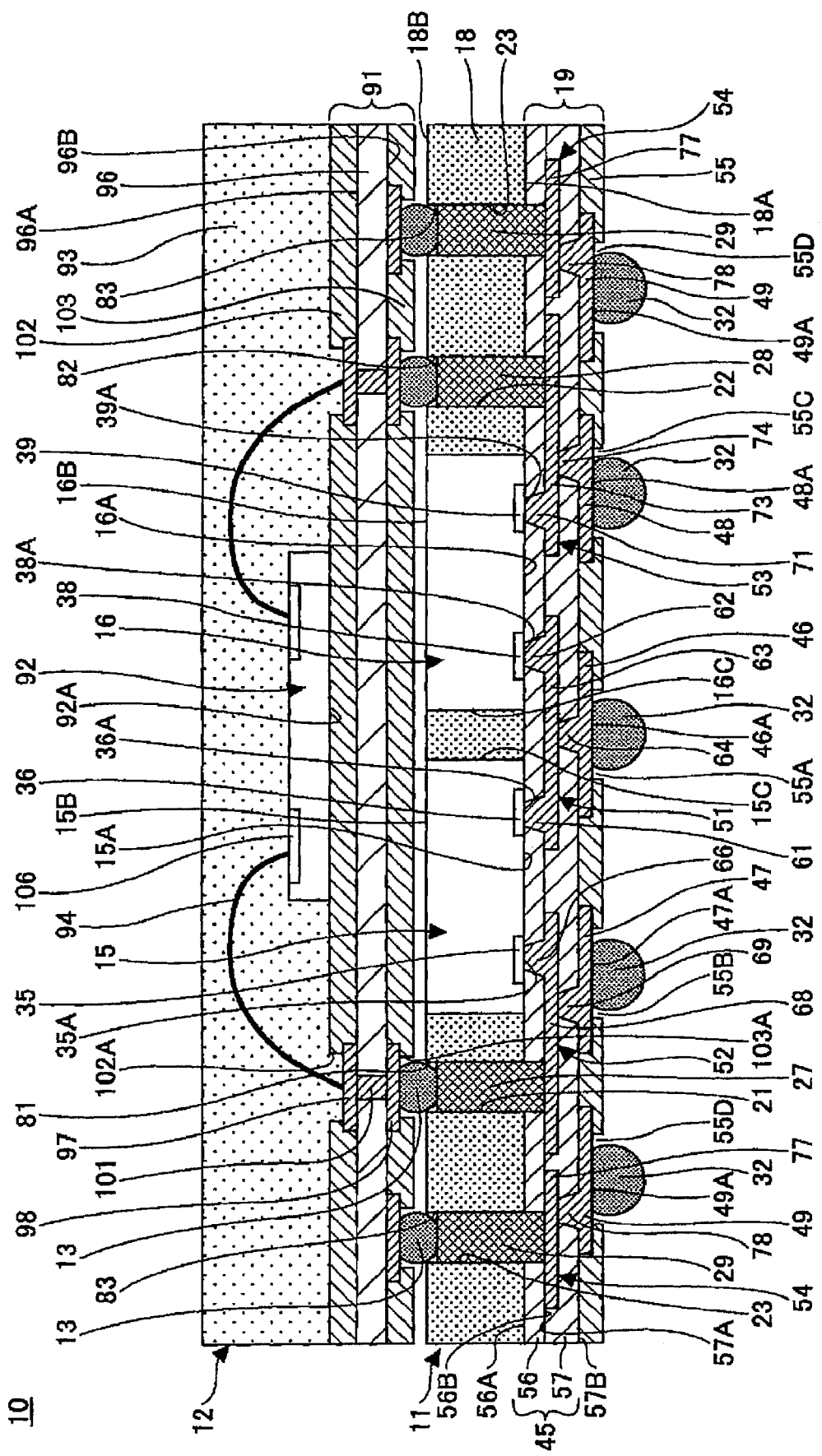
FIG. 18 is a sixteenth view illustrating the process of producing the electronic device according to the exemplary embodiment.

Next, in the process shown in FIG. 18, positioning of the second semiconductor device 12 is performed with respect to the first semiconductor device 11, and then the internal connection terminals 13 provided in the second semiconductor device 12 are connected (bonded) to the conductive members 27 to 29. Accordingly, the first semiconductor device 11 is electrically connected to the second semiconductor device 12 through the internal connection terminals 13, and the electronic device 10 according to the exemplary embodiment is produced.

According to the method of producing the semiconductor device of the exemplary embodiment, the electrode pads 35, 36, 38, and 39 are directly connected to the vias 61, 62, 66, and 71, respectively, and thus it is possible to electrically connect the electronic components 15 and 16 to the multilayer wiring structure 19 without using a bump. Accordingly, it is possible to reduce the size in thickness of the first semiconductor device 11.

The face (the back faces 15B and 16B of the electronic components 15 and 16, and the face 18B of the sealing resin 18 provided on the same plane) of the first semiconductor device 11 on the side opposed to the second semiconductor device 12 is the flat face, and thus it is possible to reduce the diameter of the internal connection terminals 13 for electrically connecting the first semiconductor device 11 to the second semiconductor device 12. Accordingly, it is possible to reduce the size in thickness of the electronic device 10.

The conductive members 27 to 29 connected to the wiring patterns 52 to 54 are formed in the through-holes 21 to 23 passing through the sealing resin 18, respectively, and thus it is possible to electrically connect the conductive members 27 to 29 to the second semiconductor device 12 through the internal connection terminals 13. Accordingly, the second semiconductor device 12 can be mounted on the first semiconductor device 11.

According to the method of producing the electronic device of the exemplary embodiment, the face (the back faces 15B and 16B of the electronic components 15 and 16, and the face 18B of the sealing resin 18 provided on the same plane) of the first semiconductor device 11 on the side opposed to the second semiconductor device 12 is the flat face, and thus it is possible to reduce the diameter of the internal connection terminals 13 for electrically connecting the first semiconductor device 11 to the second semiconductor device 12. Accordingly, it is possible to reduce the size in thickness of the electronic device 10.

In addition, it is possible to increase the number of terminals (the number of internal connection terminals 13) provided between the first semiconductor device 11 and the second semiconductor device 12 by reducing the diameter of the internal connection terminals 13.

The exemplary embodiment of the invention has been described in detail above, but the invention is not limited to such a specific exemplary embodiment, and may be variously changed and modified in the scope of the main concept of the invention described in Claims.

What is claimed is:

1. A semiconductor device comprising:
    an electronic component which includes an electrode pad forming face on which electrode pads are formed, and a back face opposite to the electrode pad forming face;
    a sealing resin which includes a first face provided on the electrode pad forming face side and a second face provided on the back face side, and which is provided around the electronic component to seal up side faces of the electrode component;
    a multilayer wiring structure which is provided on the first face of the sealing resin, and in which a plurality of insulating layers, a wiring pattern and external connecting pads are stacked on each other, the plurality of insulating layers including a first insulating layer being in contact with the sealing resin; and
    a conductive member which is provided in a through-hole passing through the sealing resin and the first insulating layer,
    wherein the wiring pattern is directly connected to the electrode pads and the external connecting pads, and includes a wiring provided on a first contact face of the first insulating layer opposite to a second contact face of the first insulating layer being in contact with the sealing resin,
    wherein the conductive member is connected to the wiring,
    wherein the conductive member has a height smaller than a value obtained by adding a thickness of the sealing resin to a thickness of the first insulating layer, and
    wherein the back face of the electronic component is exposed.

2. The semiconductor device according to claim 1, wherein the conductive member is formed of conductive paste.

3. An electronic device comprising: the semiconductor device according to claim 2, the semiconductor device acting as a first semiconductor device;
    a second semiconductor device provided on the first semiconductor device; and
    an internal connection terminal provided between the first semiconductor device and the second semiconductor device and electrically connected to the conductive member of the first semiconductor device and the second semiconductor device.

4. The semiconductor device according to claim 1, wherein the multilayer wiring structure has a thickness smaller than a thickness of the sealing resin and a thickness of the electronic component.

5. An electronic device comprising: the semiconductor device according to claim 4, the semiconductor device acting as a first semiconductor device;
    a second semiconductor device provided on the first semiconductor device; and
    an internal connection terminal provided between the first semiconductor device and the second semiconductor device and electrically connected to the conductive member of the first semiconductor device and the second semiconductor device.

6. An electronic device comprising:
    the semiconductor device according to claim 1, the semiconductor device acting as a first semiconductor device;
    a second semiconductor device provided on the first semiconductor device; and
    an internal connection terminal provided between the first semiconductor device and the second semiconductor device and electrically connected to the conductive member of the first semiconductor device and the second semiconductor device.

7. An electronic device comprising:
  the semiconductor device according to claim 1, the semiconductor device acting as a first semiconductor device;
  a second semiconductor device provided on the first semiconductor device; and
  an internal connection terminal provided between the first semiconductor device and the second semiconductor device and electrically connected to the conductive member of the first semiconductor device and the second semiconductor device.

8. The semiconductor device according claim 1, wherein
  the through-hole has a constant width and passes completely through the sealing resin and the first insulating layer; and
  the conductive member has a constant width and passes through a portion of the sealing resin and completely through the first insulating layer.

9. A method of manufacturing a semiconductor device, comprising:
  forming an adhesive on a face of a supporter;
  providing an electronic component including an electrode pad forming face on which electrode pads are formed, and a back face opposite to the electrode pad forming face;
  bonding the electrode pad forming face of the electronic component to the adhesive;
  forming a sealing resin on the adhesive to cover the back face and side faces of the electronic component;
  forming, in the sealing resin, a first opening portion passing through the sealing resin;
  removing the supporter and the adhesive;
  forming a multilayer wiring structure on the electronic component and the sealing resin in the electrode pad forming face side, the multilayer wiring structure in which a plurality of insulating layers, a wiring pattern and external connecting pads are stacked on each other and the wiring pattern is directly connected to the electrode pads and the external connecting pads;
  grinding the back face of the electronic component and a face of the sealing resin in the back face side so as to be on a same plane;
  forming a through-hole exposing the wiring pattern by forming a second opening portion in a first insulating layer of the plurality of insulating layers exposed by the first opening portion of the sealing resin; and
  forming, in the first opening portion and the second opening portion, a conductive member connected to the wiring pattern, the conductive member having a height smaller than a value obtained by adding a thickness of the sealing resin to a thickness of the first insulating layer,
  wherein the back face of the electronic component is exposed.

10. The method according to claim 9, wherein the conductive member is formed of conductive paste.

11. The method according to claim 9, wherein the multilayer wiring structure is formed so as to have a thickness smaller than a thickness of the sealing resin and a thickness of the electronic component.

12. The method according to claim 9, wherein
  the through-hole has a constant width and passes completely through the sealing resin and the first insulating layer; and
  the conductive member has a constant width and passes through a portion of the sealing resin and completely through the first insulating layer.

* * * * *